United States Patent
Fujii et al.

(10) Patent No.: US 7,943,982 B2
(45) Date of Patent: May 17, 2011

(54) SEMICONDUCTOR DEVICE HAVING LAMINATED ELECTRONIC CONDUCTOR ON BIT LINE

(75) Inventors: Kenichi Fujii, Aizuwakamatsu (JP); Masahiko Higashi, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 986 days.

(21) Appl. No.: 11/444,216

(22) Filed: May 30, 2006

(65) Prior Publication Data

US 2006/0278936 A1    Dec. 14, 2006

Related U.S. Application Data

(63) Continuation of application No. PCT/JP2005/009878, filed on May 30, 2005.

(51) Int. Cl.
*H01L 29/792* (2006.01)
(52) U.S. Cl. .................. 257/324; 257/E21.336
(58) Field of Classification Search ........... 257/324–326
See application file for complete search history.

(56) References Cited

U.S. PATENT DOCUMENTS

| | | | |
|---|---|---|---|
| 2002/0000592 A1* | 1/2002 | Fujiwara | 257/296 |
| 2003/0067032 A1* | 4/2003 | Caprara et al. | 257/324 |
| 2004/0262674 A1 | 12/2004 | Shimizu | |

FOREIGN PATENT DOCUMENTS

| | | |
|---|---|---|
| JP | 07066372 | 3/1995 |
| JP | 07106443 | 4/1995 |
| JP | 2000514946 T | 11/2000 |
| JP | 2002026149 | 1/2002 |
| JP | 2005057127 | 3/2005 |
| WO | WO9803977 | 1/1998 |

* cited by examiner

*Primary Examiner* — Thanh Nguyen (57) ABSTRACT

There are provided a semiconductor device and a fabrication method therefor including an ONO film (18) formed on a semiconductor substrate (10), a word line (24) formed on the ONO film (18), a bit line (20) formed in the semiconductor substrate (10), and a conductive layer (32) that is in contact with the bit line (20), runs in a length direction of the bit line (20), and includes a polysilicon layer or a metal layer. In accordance with the present invention, a semiconductor device and a fabrication method therefor are provided wherein degradation of the writing and erasing characteristics and degradation of the transistor characteristics such as a junction leakage are suppressed, and the bit line resistance is decreased.

17 Claims, 12 Drawing Sheets

SEMICONDUCTOR DEVICE HAVING LAMINATED ELECTRONIC CONDUCTOR ON BIT LINE

CROSS-REFERENCES TO RELATED APPLICATIONS

This is a continuation of International Application No. PCT/JP2005/009878, filed May 30, 2005 which was not published in English under PCT Article 21(2).

BACKGROUND OF THE INVENTION

1. Field of the Invention

This invention relates generally to semiconductor devices and fabrication methods therefor, and more particularly, to a semiconductor device having bit lines formed in a semiconductor substrate and a fabrication method therefor.

2. Description of the Related Art

In recent years, data-rewritable, non-volatile memory semiconductor devices have been widely used. Technical developments downsizing the memory cells of such non-volatile memory semiconductor devices are being promoted to obtain higher storage capacity. For example, there have been developed flash memories having an Oxide/Nitride/Oxide (ONO) film such as Metal Oxide Nitride Oxide Silicon (MONOS) or Silicon Oxide Nitride Oxide Silicon (SONOS).

Among such memories, there has been developed a flash memory in which one memory cell transistor has two or more charge storage regions to obtain higher storage capacity. As disclosed in Japanese Patent Application Publication No. 2000-514946 (hereinafter, referred to as conventional art), a memory cell transistor has two charge storage regions between the gate electrode and the semiconductor substrate. In this transistor, the source and the drain are switchable for symmetrical operation, creating a structure wherein the source and the drain are indistinguishable. Also, the bit lines are embedded in the semiconductor substrate and coupled to the source and drain and can act as either a source region or a drain region, thereby achieving miniaturization of the memory cell.

Figure 1A:
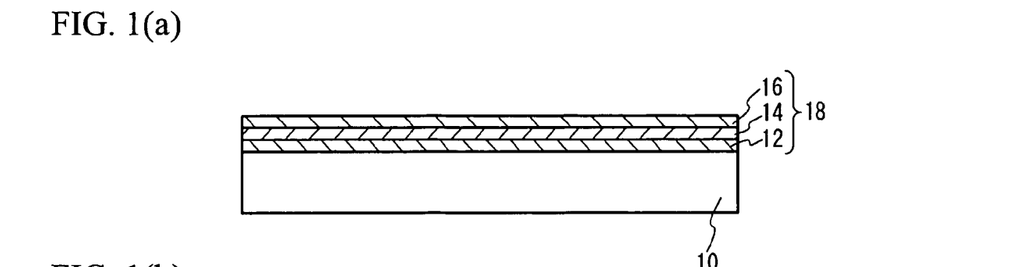
FIG. 1(a) through FIG. 1(e) are cross-sectional views illustrating a fabrication method of a memory cell in accordance with a conventional flash memory.
Figure 1B:
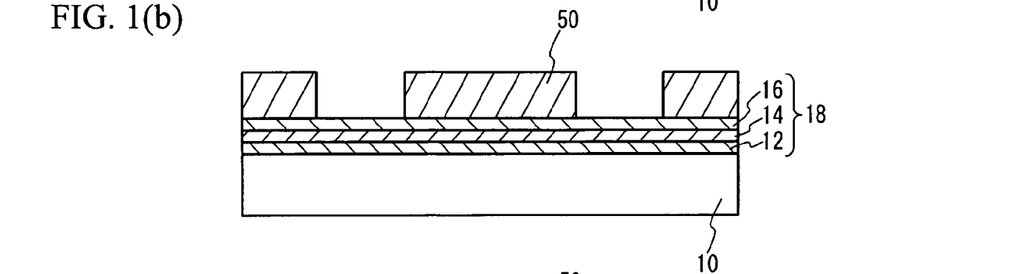

Referring to FIGS. 1(a) through 1(e), a description will be given of a conventional fabrication method of memory cells in accordance with the afore-described conventional art. In FIG. 1(a), a tunnel oxide film (silicon oxide film) 12, a trap layer (silicon nitride film) 14, and a top oxide film (silicon oxide film) 16 are formed on a P-type semiconductor substrate 10, as an ONO film 18. In FIG. 1(b), a photoresist 50 is applied to form openings in accordance with generally used lithography techniques.

Figure 1C:
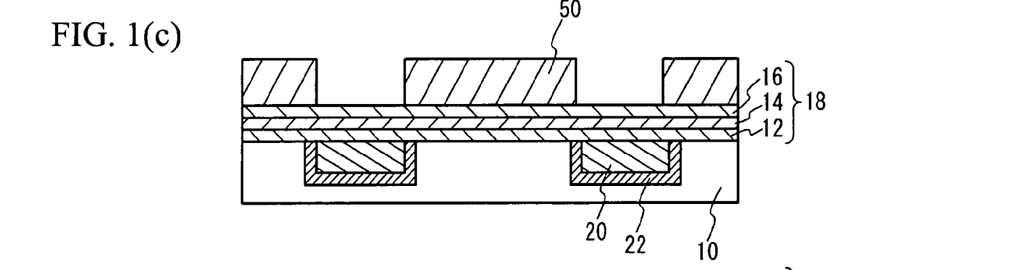

In FIG. 1(c), arsenic ions, for example, are implanted in the substrate 10 by using the photoresist 50 serving as a mask to form bit lines 20. Pocket injection is performed using the photoresist 50 serving as a mask to form pocket injection regions 22. Pocket injection is a method of forming a P-type region having a concentration higher than that of the P-type semiconductor substrate 10, by injecting, for example, boron obliquely to a vertical direction of the semiconductor substrate 10. This realizes a steep junction profile near the bit line 20, improving writing characteristics of the memory cell.

Figure 1D:
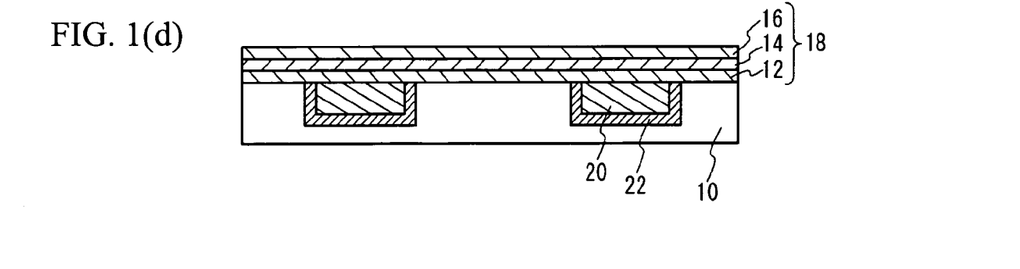

In FIG. 1(d), the photoresist 50 is removed. And in FIG. 1(e), a word line 24 is formed on the ONO film 18. Subsequently, an interlayer insulating film, a metal line, and a protection film are formed, and a flash memory is thus fabricated.

Figure 1E:
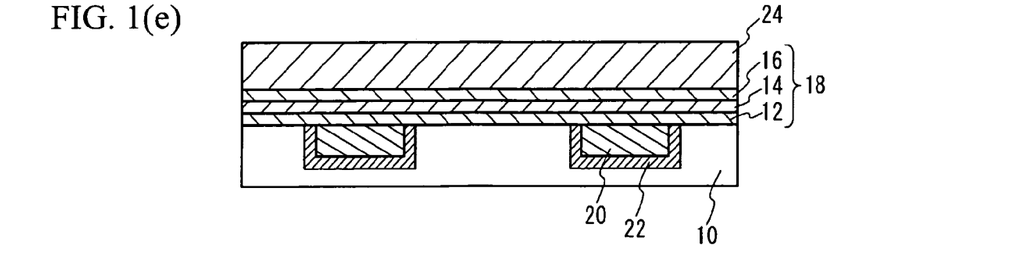

According to the conventional art, a non-volatile memory device is configured such that the semiconductor substrate 10 provided between the bit lines (source/drain regions) 20 functions as a channel, and the charge is stored in the trap layer 14 of the ONO film 18 provided between the channel and the word line (gate electrode) 24. There are two charge storage regions between the bit lines 20 below the word line 24.

The charge is stored in the ONO film 18 by applying a high electric field between the source region and the drain region (namely, between the bit lines 20) and injecting electrons having high energy into the trap layer 14 in the ONO film 18. Data is erased by injecting holes having high energy into the trap layer 14. Therefore, there is a need for forming the shallow bit lines 20 and a steep junction profile in order to improve writing and erasing characteristics.

In addition, as the bit lines 20 are formed in diffusion regions, they have a higher resistance than that of a metal. Accordingly, the writing and erasing characteristics are degraded. For this reason, the bit lines 20 are connected to the metal line (above the word line 24 and the interlayer insulating film) by contact holes formed in the interlayer insulating film across every several word lines 24.

In the conventional art, the memory cell can be downsized by reducing the resistance of the bit line 20. As the resistance of the bit line 20 is reduced, the bit line width can be reduced because the number of the contact holes, each of which connects the bit line 20 and the metal line, can be reduced.

The resistance of the bit line 20 can be decreased by increasing the ion implantation energy or dose when the bit line 20 is formed. However, an increase in the ion implantation dose increases a junction leakage current between the bit line 20 and the semiconductor substrate 10. In other words, if the resistance of the bit line is decreased to downsize the memory cell, the junction leakage current will be increased, thereby degrading the transistor characteristic of the memory cell.

Thus, to improve the writing and erasing characteristics, there is a need for forming shallow source/drain regions (namely, the bit lines 20) and the steep junction profile. However, such shallow source/drain regions (the bit lines 20) increase the resistance of the bit line 20, running counter to the above-described goal of miniaturization of the memory cell.

SUMMARY OF THE INVENTION

The present invention has been made in view of the above circumstances and it is, therefore, an object of the present invention to provide a semiconductor device and a fabrication method therefor in which the degradation of the transistor characteristics of the memory cells are suppressed while the resistance of the bit line can be decreased.

According to an aspect of the present invention, preferably, there is provided a semiconductor device including an ONO film formed on a semiconductor substrate, a word line formed on the ONO film, a bit line formed in the semiconductor substrate, and a conductive layer that is in contact with the bit line, runs in a length direction of the bit line, and includes a polysilicon layer or a metal layer. In accordance with the present invention, the conductive layer having a low resistance is capable of reducing the resistance of two layers of the bit line and the conductive layer (referred to as a bit line resistance), thereby enabling an increase in the injection energy and dose into the bit line. This can improve the writing and erasing characteristics and suppress the junction leakage current. Thus, a semiconductor device can be provided in accordance with the present invention wherein the degradation of the writing and erasing characteristics and the transistor characteristics such as the junction leakage are suppressed while the bit line resistance is further decreased.

According to another aspect of the present invention, preferably, there is provided a method of fabricating a semiconductor device including forming a tunnel oxide film and a trap layer on a semiconductor substrate, forming a bit line in the semiconductor substrate, forming an opening in contact with the bit line in the tunnel oxide film and in the trap layer, and forming a conductive layer that includes a polysilicon layer or a metal layer to be in contact with the bit line and run in a length direction of the bit line. A semiconductor device thus formed which makes it possible to improve the writing and erasing characteristics and to suppress the junction leakage current. Thus, a semiconductor devices can be provided by fabrication methods in accordance with the present invention which suppress the degradation of the writing and erasing characteristics and the transistor characteristics such as the junction leakage, while further decreasing the bit line resistance.

DESCRIPTION OF THE PREFERRED EMBODIMENTS

A description will now be provided, with reference to the accompanying drawings, of embodiments of the present invention.

First Embodiment

Figure 2:
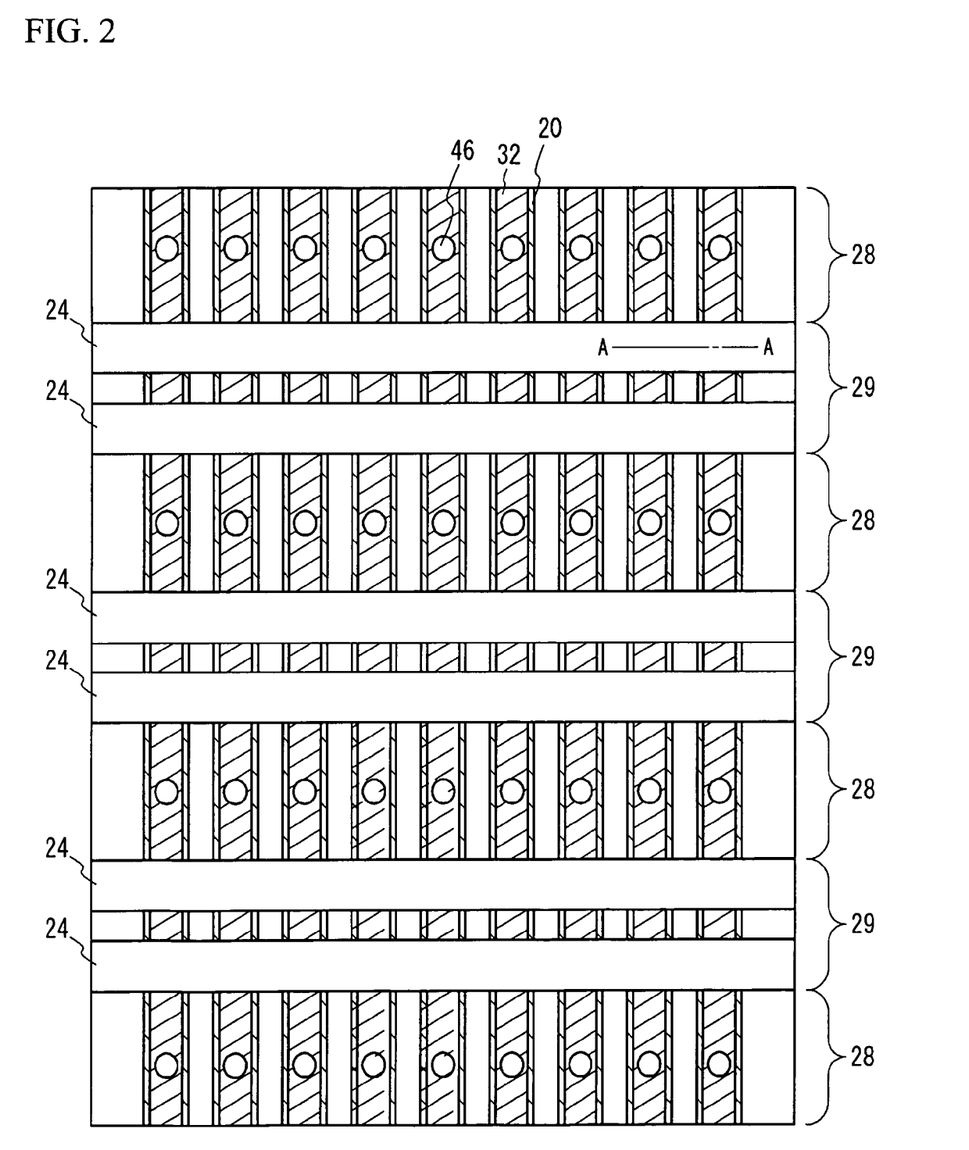
FIG. 2 is a top view of a memory cell in a flash memory semiconductor device in accordance with a first embodiment of the present invention.
Figure 3:
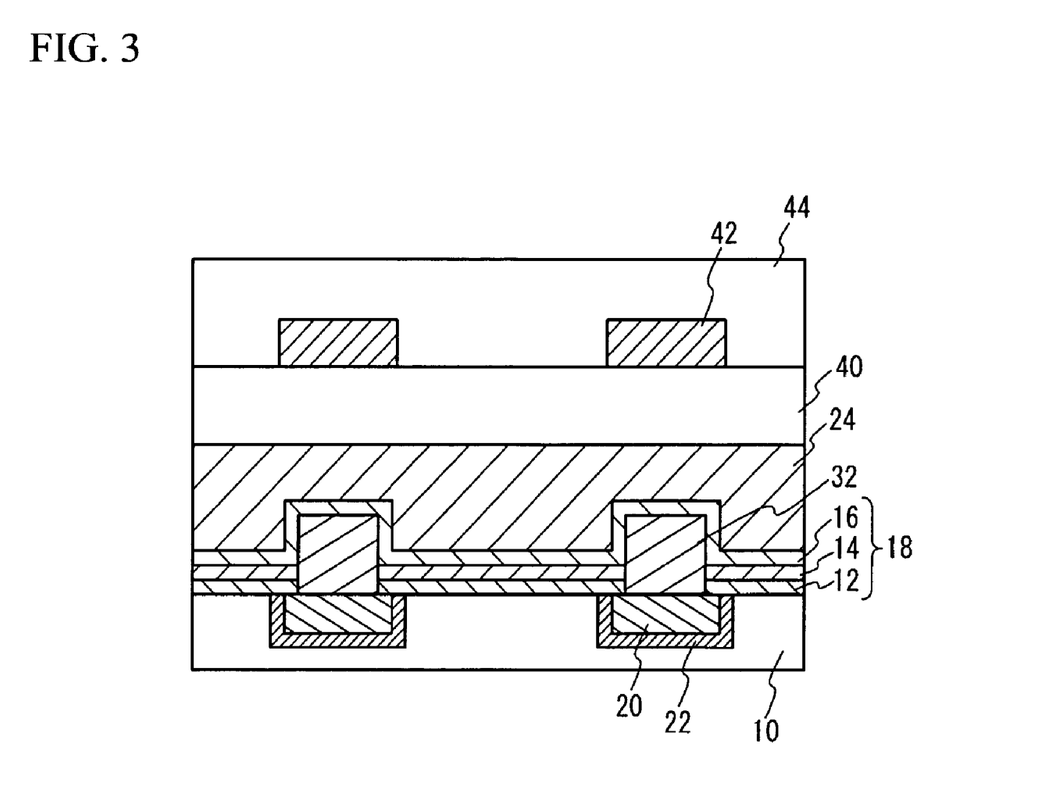
FIG. 3 is a cross-sectional view taken along a line A-A shown in FIG. 2 in accordance with the first embodiment of the present invention.

FIG. 2 is a top view of a memory cell in a flash memory in accordance with a first embodiment of the present invention (a protection layer 44, a metal line 42, an interlayer insulating film 40, and an ONO film 18 are not shown). FIG. 3 is a cross-sectional view taken along a line A-A shown in FIG. 2.

Referring to FIGS. 2 and 3, bit lines 20 that serve as the source/drain regions are provided in a P-type silicon semiconductor substrate 10 (alternatively in a P-type region of a semiconductor substrate) and a pocket injection region 22 is formed at both sides of the bit line 20. A conductive layer 32 is provided over the bit line 20 and in contact with therewith, running in a length direction of the bit line 20.

An ONO film 18, composed of a tunnel oxide film 12, a trap layer 14, and a top oxide film 16, is provided on the semiconductor substrate 10. A word line 24 is formed on the ONO film 18. The word line 24 and the conductive layer 32 are isolated from each other by the top oxide film 16 included in the ONO film 18. An interlayer insulating film 40 is provided over the word line 24, and a metal line 42 is provided on the interlayer insulating film 40 to be connected to the bit line 20 and the conductive layer 32 via a contact hole 46. A protection layer 44 is provided over the interlayer insulating film 40 and the metal line 42.

The bit line 20 and the conductive layer 32 are connected to the metal line 42 across several word lines 24 (two word lines are shown in FIG. 2 as an example, but another example may be every sixteen word lines) via the contact hole 46. A bit line contact region 28 is a region where the contact hole 46 is disposed, and a word line region 29 is a region where the word lines 24 are disposed.

Referring to FIG. 4(a) through FIG. 5(d), a description will be given of a fabrication method of the flash memory in accordance with the first embodiment of the present invention. FIG. 4(a) through FIG. 5(d) correspond to the cross-sectional view taken along the line A-A shown in FIG. 2.

Figure 4A:
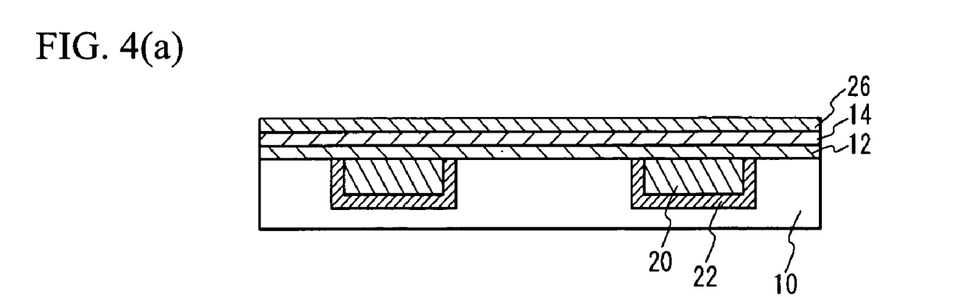
FIG. 4(a) through FIG. 4(d) are first cross-sectional views illustrating a fabrication method of a memory cell in accordance with the first embodiment of the present invention.

In FIG. 4(a), the tunnel oxide film (silicon oxide film) 12 is formed on the P-type silicon semiconductor substrate (alternatively in a P-type region of the semiconductor substrate) 10 by a conventional thermal oxidation method. In addition, the trap layer (silicon nitride film) 14 and the protection film (silicon oxide film) 26 are successively deposited thereon by chemical vapor deposition (CVD). The tunnel oxide film 12 has a thickness of, for example, 7.5 nm, the trap layer 14 has a thickness of, for example, 12 nm, and the protection film 26 has a thickness of, for example, 10 nm.

In a similar fashion as shown in FIG. 1(b) through FIG. 1(d), arsenic ions are implanted in the semiconductor substrate 10 to form the bit lines 20 therein with an injection energy of 40 keV and a dose of $1.5 \times 10^{15}$ cm$^{-2}$. Subsequently, the pocket injection regions 22 are formed and then treated with heat.

Figure 4B:
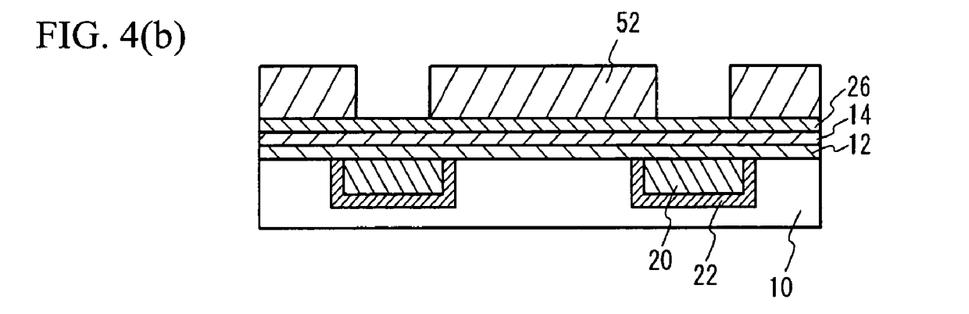
Figure 4C:
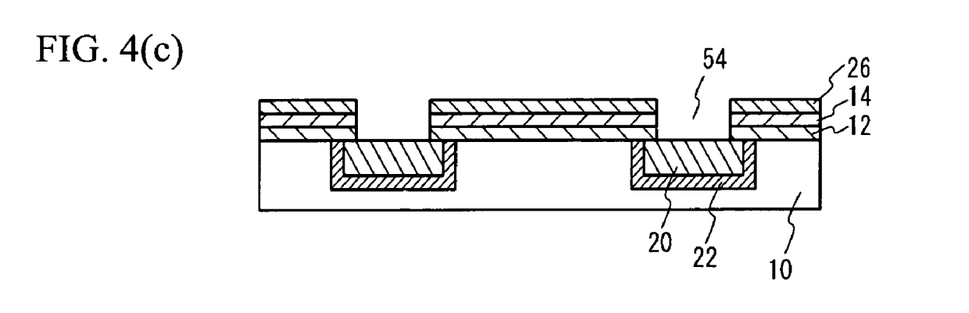
Figure 4D:
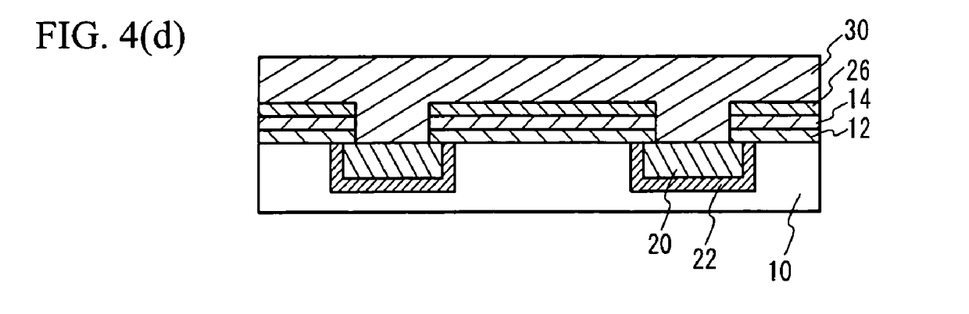

In FIG. 4(b), a photoresist 52 having given openings is provided by using a conventional lithography technique. Referring to FIG. 4(c), the protection film 26, the trap layer 14, and the tunnel oxide film 12 are etched away by using the photoresist 52 as a mask. In this manner, openings 54 are formed in the protection film 26, the trap layer 14, and the tunnel oxide film 12, to be in contact with the bit line 20. In FIG. 4(d), a P-type doped polysilicon layer 30 is formed in the openings 54 and on the protection film 26.

Figure 5A:
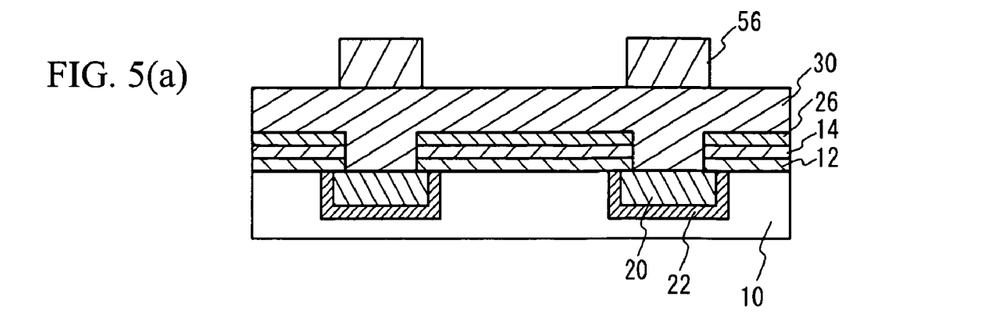
FIG. 5(a) through FIG. 5(d) are additional cross-sectional views illustrating the fabrication method of a memory cell in accordance with the first embodiment of the present invention.
Figure 5B:
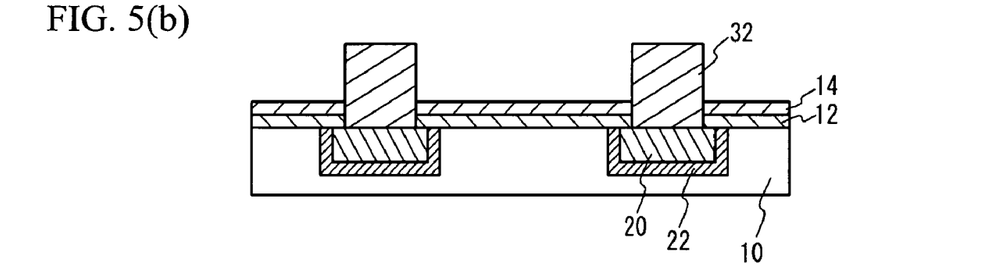

Referring to FIG. 5(a), a photoresist 56 having given openings is formed by employing conventional lithography techniques. In FIG. 5(b), the polysilicon layer 30 has been etched away with the photoresist serving as a mask, to form the conductive layer 32 in contact with the bit line 20 and running in a length direction therewith. The conductive layer 32 includes the polysilicon layer 30 and has a thickness of, for example, 50 nm. Then, the protection film 26 is removed.

Figure 5C:
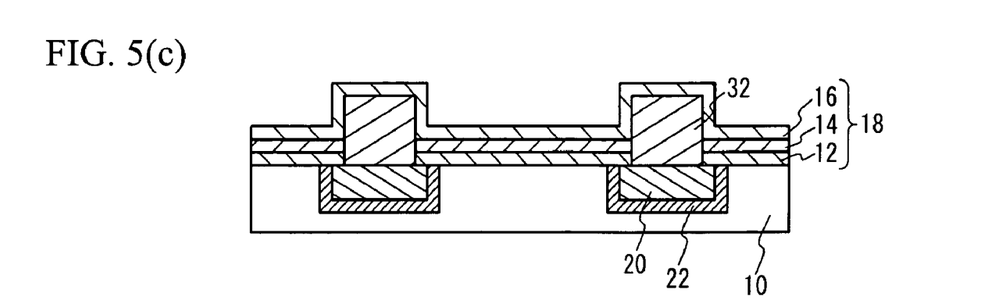
Figure 5D:
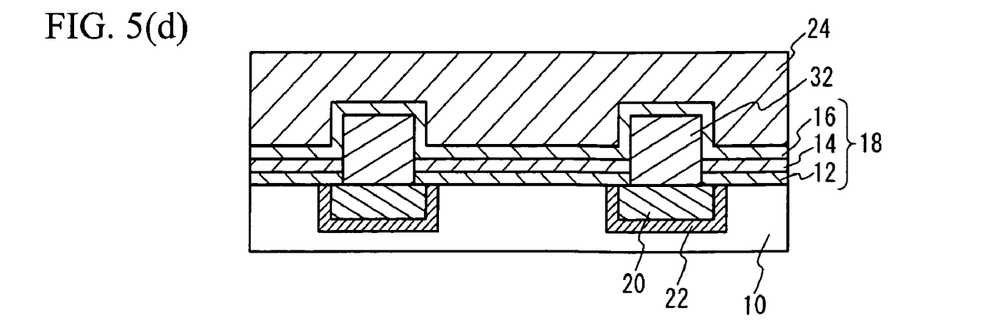

Referring to FIG. 5(c), the top oxide film 16 is next deposited by CVD to cover the trap layer 14 and the conductive layer 32. The top oxide film 16 has a thickness of, for example, 10 nm. Accordingly, the ONO film 18 has a thickness of, for example, approximately 30 nm. Referring to FIG. 5(d), the word line 24 of polysilicon is formed on the top oxide film 16 by conventional lithography and etching techniques. Then, as the interlayer insulating film 40, an oxide silicon film of Boro-Phospho Silicated Glass (BPSG) or the like is formed. The contact hole 46 is formed in the interlayer insulating film 40 to embed a metal such as Ti/WN and W or Ti/TiN and W in the contact hole 46. Aluminum is formed into the metal line 42, and the protection layer 44 is formed thereover. In this manner, the flash memory shown in FIG. 3 is completed.

The flash memory employed in the first embodiment is configured in such a manner that the conductive layer 32 is provided on the bit line 20 in contact therewith. The conductive layer 32 is made up of a P-type doped polysilicon layer, which has a lower resistance than that of the bit line 20 formed in the diffusion layer of the semiconductor substrate 10.

The conductive layer 32 of a low resistance can lower the average resistance of the two layers (i.e., the bit line 20 and the conductive layer 32 (hereinafter, referred to as bit line resistance)), decreasing the injection energy and dose required to form the bit line 20. This enables improvement of writing and erasing characteristics and suppression of the junction leakage current. In addition, it is possible to increase the number of word lines 24 across which the bit line 20 and the conductive layer 32 are connected to the metal line 42. In other words, the word line region 29 (FIG. 2) can be enlarged and the area occupied by the bit line contact region 28 (FIG. 2) can be reduced in the memory cell. In addition, the width of the bit line 20 and the conductive layer 32 can be reduced. Thus, in accordance with the present invention, the memory cell can be downsized.

As previously stated, in accordance with the first embodiment of the present invention, it is possible to suppress the degradation of the writing and erasing characteristics and the degradation of the transistor characteristics such as the junction leakage current and, in addition, it is possible to reduce the bit line resistance.

As stated with the exemplary measurements as described above in accordance with the first embodiment of the present invention, the resistance of the conductive layer 32 can be lowered by making the conductive layer 32 thicker than the ONO film 18 further lowering the bit line resistance.

The word line 24 and the conductive layer 32 are isolated from each other by the top oxide film 16 in the ONO film 18. In accordance with the fabrication method described herein in accordance with the first embodiment of the present invention, the word line 24 and the conductive layer 32 are isolated by a top oxide film 16 that has an excellent film quality because the top oxide film 16 has not undergone various processes. Therefore, leakage current can be further suppressed between the word line 24 and the conductive layer 32.

During formation thereof, the conductive layer 32 is successively provided in a current-flowing direction, thereby enabling the bit line resistance to be further lowered.

The openings 54 are formed in the protection film 26 while the protection film 26 is formed on the trap layer 14 in FIG. 4(c) and simultaneous with forming the openings 54 in the tunnel oxide film 12 and the trap layer 14. This prevents the trap layer 14 from being damaged during the subsequent fabrication processes.

As shown in FIG. 5(b), the protection film 26 is removed and the top oxide film is provided on the trap layer 14 and the conductive layer 32 to cover them. Subsequently, as shown in FIG. 5(d), the word line is provided on the top oxide film 16. In this manner, the word line 24 and the conductive layer 32 are isolated by the top oxide film 14 in the ONO film 18. It is thus possible to further suppress the leakage current between the word line 24 and the conductive layer 32.

From FIG. 4(d) through FIG. 5(b), as processing forms the conductive layer 32, the polysilicon layer 30 is provided above the trap layer 14 and in the openings 54, and the polysilicon layer 30 is etched away except for the polysilicon layer 30 in the openings 54. By forming the conductive layer 32 in this manner, the conductive layer 32 can be formed thicker than the ONO film 18.

As an alternate example of processing, the protection film 26 may not be removed in FIG. 5(b), and a portion of the oxide film 16 is provided on the protection film 26 and on the conductive layer 32 to cover them in FIG. 5(b), so that the top oxide film 16 may be composed of the protection film 26 and the portion of the top oxide film 16. In the afore-described example, the process step for removing the protection film 26 can be eliminated while still isolating the word line 24 and the conductive layer 32 from each other by a portion of the top oxide film 16 in the ONO film 18. As stated above, the word line 24 and the conductive layer 32 are thus isolated by the portion of the top oxide film 16 having an excellent film quality, because the top oxide film 16 has not undergone various processes. It is thus possible to suppress the leakage current between the word line 24 and the conductive layer 32.

Figure 6A:
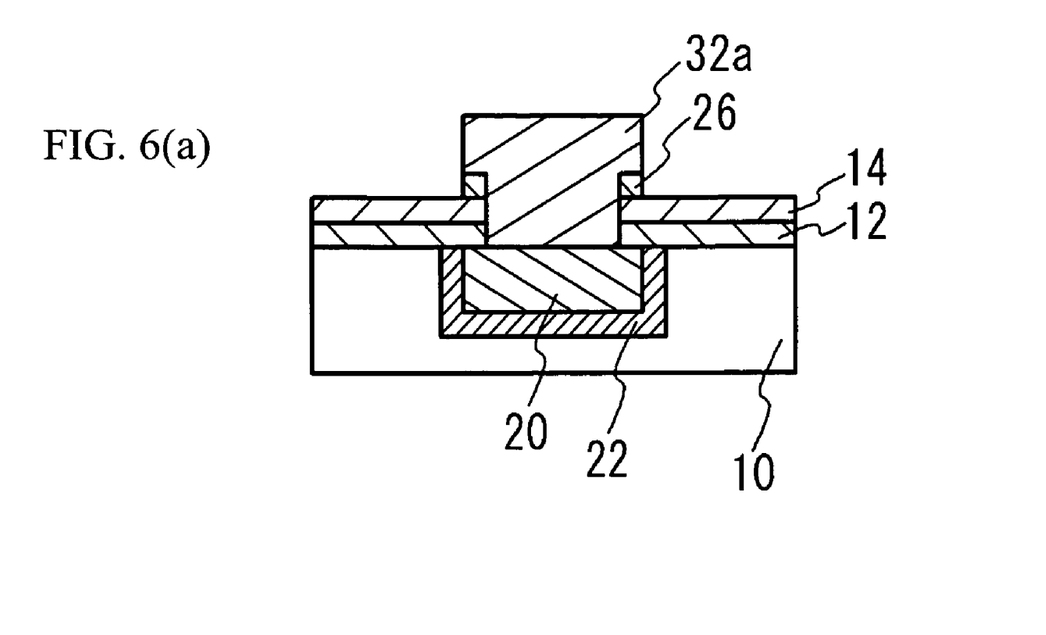
FIG. 6(a) and FIG. 6(b) are cross-sectional views of a conductive layer and periphery thereof in accordance with a variation example of the first embodiment of the present invention.
Figure 6B:
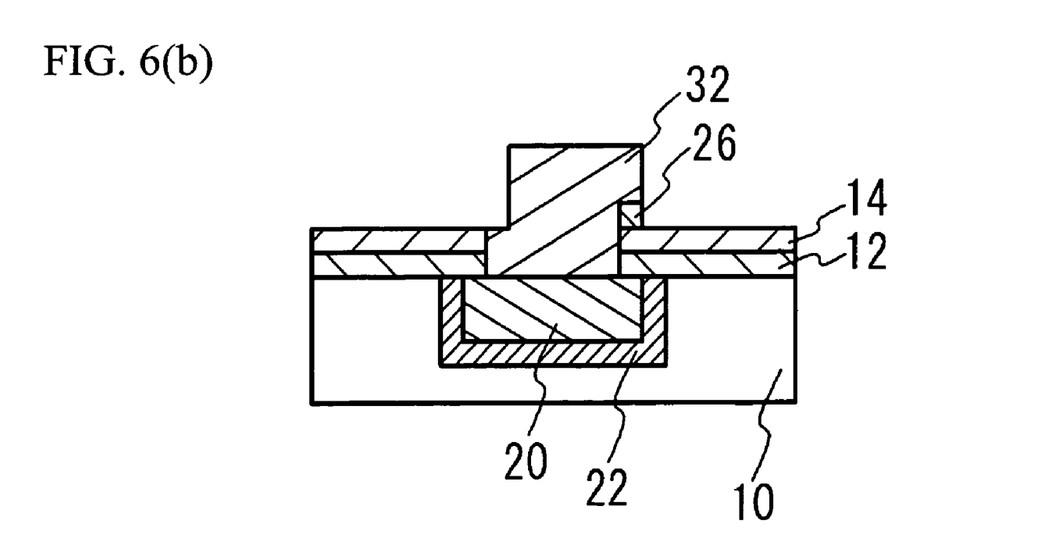

A variation example of the first embodiment is now described, by reference to FIGS. 6(a) and 6(b). When the polysilicon layer 30 is etched away to form the conductive layer 32 as shown in FIG. 5(a) and FIG. 5(b), it is possible to make a conductive layer 32a have a width greater than that of the opening 54. FIG. 6(a) is a cross-sectional view of the conductive layer 32a and periphery thereof in accordance with this example. Other than the conductive layer 32a, FIG. 6(a) shows the same components and configurations as those of FIG. 5(b).

In accordance with the first embodiment, if the photoresist 56 and the openings 54 are misaligned, the cross-section of the conductive layer 32 shown in FIG. 5(b) will be deformed as shown in FIG. 6(b). In accordance with the variation example of the first embodiment as described in reference to FIG. 6(a), such deformation can be prevented, thereby preventing the contact hole 46 from deviating from the conductive layer 32. Also, when the polysilicon layer 30 is etched away, it is possible to prevent the polysilicon layer 30 from being partially etched to reach the bit line 20 and to prevent the bit line 20 from being damaged by providing a conductive layer 32a having a width greater than that of the opening 54.

Second Embodiment

Figure 7A:
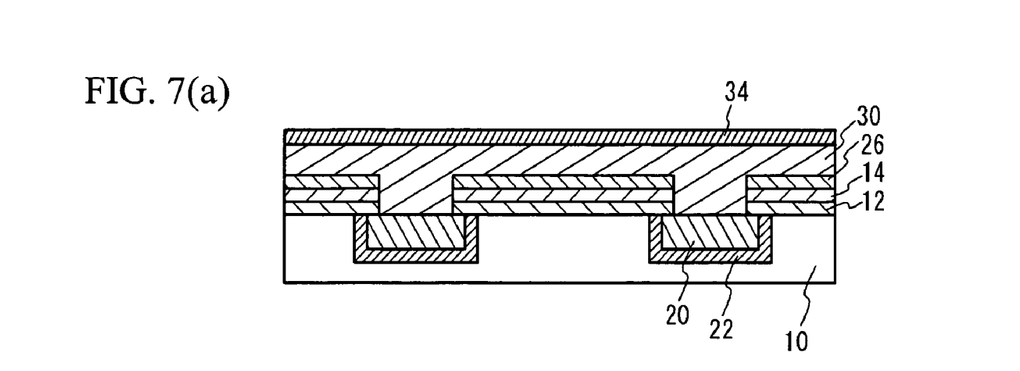
FIG. 7(a) through FIG. 7(b) are cross-sectional views illustrating a fabrication method of a flash memory in accordance with a second embodiment of the present invention.
Figure 7B:
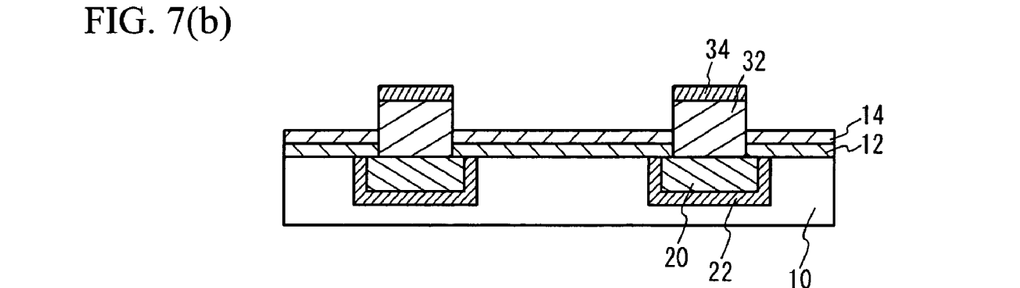
Figure 7C:
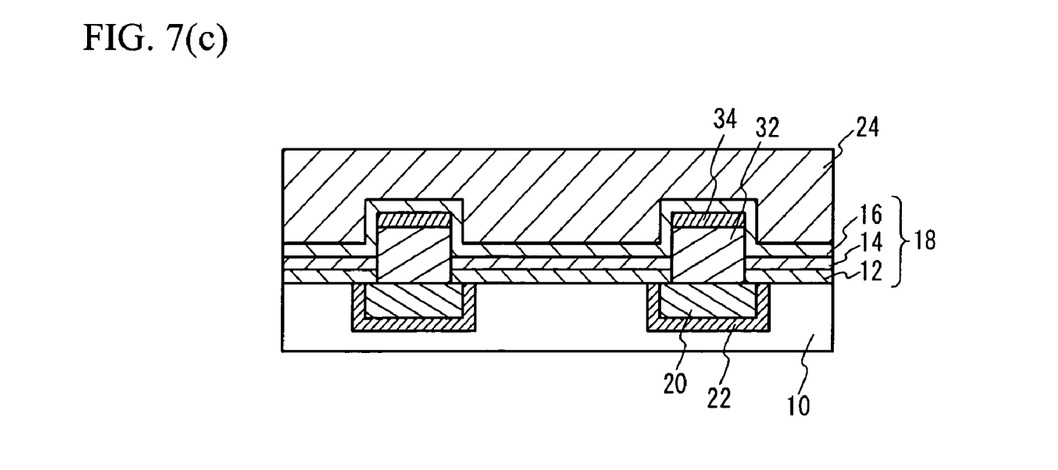

FIG. 7(a) through FIG. 7(c) are cross-sectional views illustrating a fabrication method of a flash memory in accordance with a second embodiment of the present invention. Hereinafter, in the description of the process in accordance with the second embodiment, the same components and configurations as those in accordance with the first embodiment have the same reference numerals and a detailed explanation thereof will be omitted. As described in accordance with the first embodiment, similar fabrication process steps through FIG. 4(d) are performed. Referring now to FIG. 7(a), a metal silicide layer 34 of, for example, cobalt or titanium is deposited on the polysilicon layer 30 by sputtering and thereafter treated with heat. This produces a silicide surface on the polysilicon layer 30 thereby providing the metal silicide layer 34.

Referring next to FIG. 7(b), given regions of the metal silicide layer 34 and the polysilicon layer 30 are etched away. In this manner, the metal silicide layer 34 is formed on the conductive layer 32. Referring to FIG. 7(c), in a similar fashion as the first embodiment, the protection film 26 is removed, the top oxide film 16 is formed, with the word line 24 formed subsequent to and on the top oxide film 16. Subsequently, the interlayer insulating film 40, the metal line 42, and the protection layer 44 are formed, thereby fabricating a flash memory in accordance with the second embodiment of the present invention.

In accordance with the second embodiment, the bit line resistance can be further reduced, as compared to that the bit line resistance of the flash memory formed in accordance with the first embodiment, by providing on the conductive layer 32 the metal silicide layer 34 having a resistance lower than that of the conductive layer 32. Thus, in accordance with the second embodiment of the present invention it is possible to further suppress the degradation of the writing and erasing characteristics and the degradation of the transistor characteristics such as the junction leak, and to further reduce the bit line resistance.

Third Embodiment

Figure 8A:
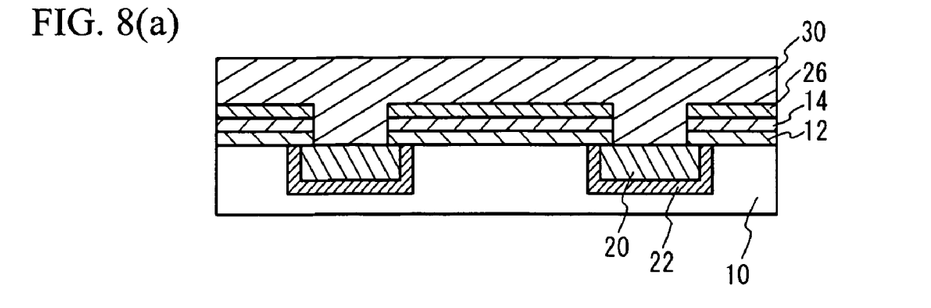
FIG. 8(a) through FIG. 8(d) are cross-sectional views illustrating a fabrication method of a flash memory in accordance with a third embodiment of the present invention.
Figure 8B:
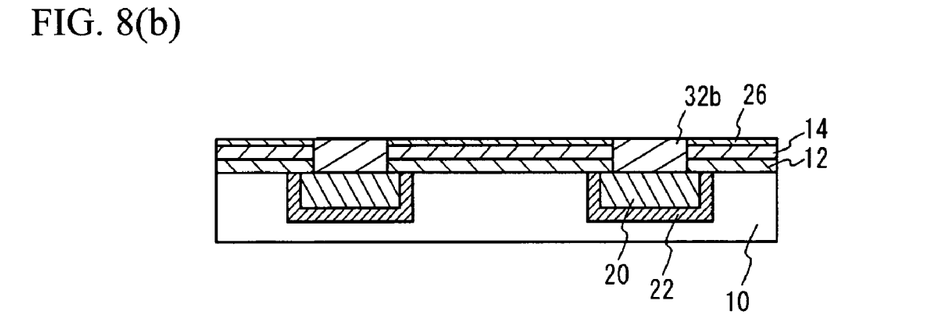

FIGS. 8(a) through 8(d) are cross-sectional views illustrating a fabrication method of a flash memory in accordance with a third embodiment of the present invention. Hereinafter, in the description of the process in accordance with the third embodiment, the same components and configurations as those in accordance with the first embodiment have the same reference numerals and a detailed explanation thereof will be omitted. As described in accordance with the first embodiment, similar fabrication process steps through FIG. 4(b) are performed. Referring now to FIG. 8(a), the polysilicon layer 30 is provided on the protection film 26 and in the openings 54. In FIG. 8(a), the polysilicon layer 30 and the protection film 26 are polished by chemical mechanical polishing (CMP), polishing the protection film 26 to a given thickness. In this manner, a conductive layer 32b is provided.

Figure 8C:
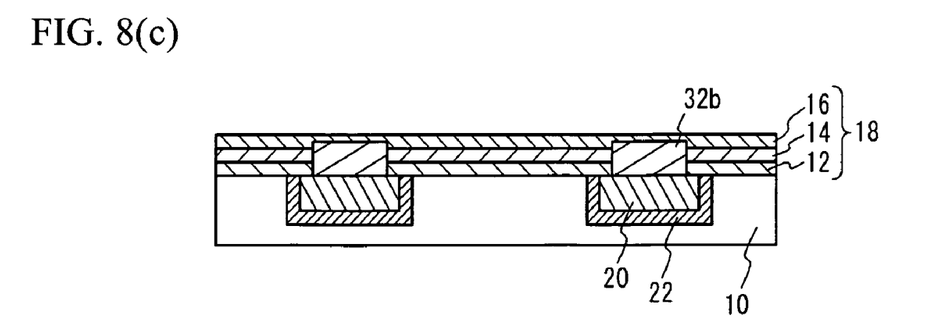
Figure 8D:
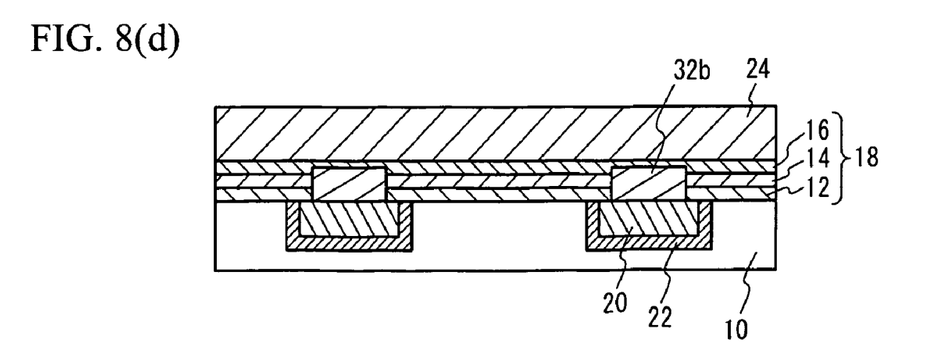

Referring to FIG. 8(c), a portion of the top oxide film (oxide silicon film) 16 is provided on the protection film 26 and on the conductive layer 32b, so that the top oxide film 16 is made up of the remaining thickness of the protection film 26 and the top oxide film. Referring to FIG. 8(d), the word line 24 is formed on the top oxide film 16 in a similar fashion as described in the first embodiment. Subsequently, the interlayer insulating film 40, the metal line 42, and the protection layer 44 are formed, and the flash memory is completed in accordance with the third embodiment.

By polishing the polysilicon layer 30 and the protection film 26 by CMP in accordance with the third embodiment, where the protection film 26 is polished to a given thickness, the conductive layer 32b is embedded in the ONO film 18, the ONO film 18 is planarized, and the word line 24 can be formed to have a plane surface. This enables the memory cell to be further miniaturized. In accordance with the first embodiment, it is possible to increase the thickness of the conductive layer 32 and reduce the resistance thereof. However, the ONO film 18 cannot be planarized. In contrast, in accordance with the third embodiment, the ONO film 18 can be planarized. However, the thickness of the conductive layer 32b cannot be increased, and the resistance thereof is increased. Therefore, the first embodiment may be suitable where the resistance of the conductive layer 32 should be further reduced, and the third embodiment may be suitable where the ONO film 18 should be further planarized.

A portion of the top oxide film 16 is provided on the protection film 26 and on the conductive layer 32b, so that the top oxide film 16 is made up of the protection film 26 and the portion of the top oxide film 16. Then, the word line 24 is provided on the top oxide film 16. With the afore-described configuration, the word line 24 and the conductive layer 32b are isolated from each other by the portion of the top oxide film 16 in the ONO film 18. Thus, the word line 24 and the conductive layer 32 are isolated by the portion of the top oxide film 16 that has an excellent film quality because the portion of the top oxide film 16 has not undergone various processes. This enables the leakage current between the word line 24 and the conductive layer 32 to be suppressed. In addition, the protection film 26 is not removed, thereby further reducing the fabrication process steps.

Fourth Embodiment

Figure 9A:
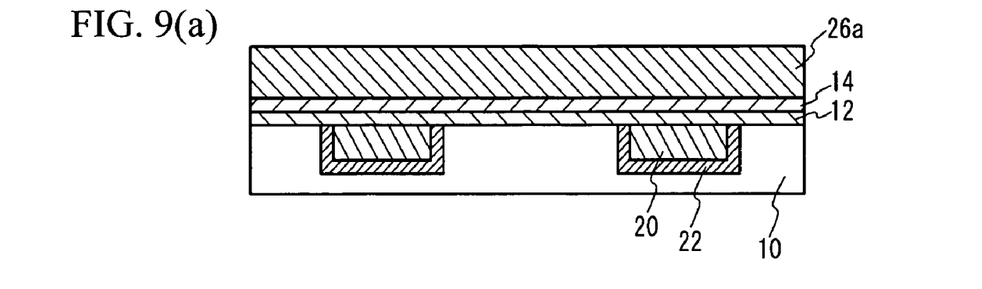
FIG. 9(a) through FIG. 9(d) are first cross-sectional views illustrating a fabrication method of a flash memory in accordance with a fourth embodiment of the present invention.

FIG. 9(a) through FIG. 10(b) are cross-sectional views illustrating a fabrication method of a flash memory in accordance with a fourth embodiment of the present invention. Hereinafter, in the description of the process in accordance with the fourth embodiment, the same components and configurations as those in accordance with the first embodiment have the same reference numerals and a detailed explanation thereof will be omitted. FIG. 9(a) corresponds to FIG. 4(a) described in accordance with the first embodiment, except that a protection film 26a is formed thicker than the protection film 26 used in the first embodiment. The protection film 26a has a thickness of, for example, 50 nm.

Figure 9B:
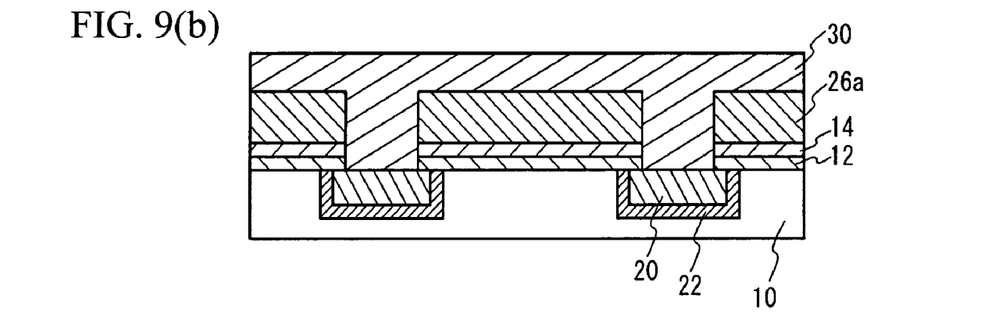
Figure 9C:
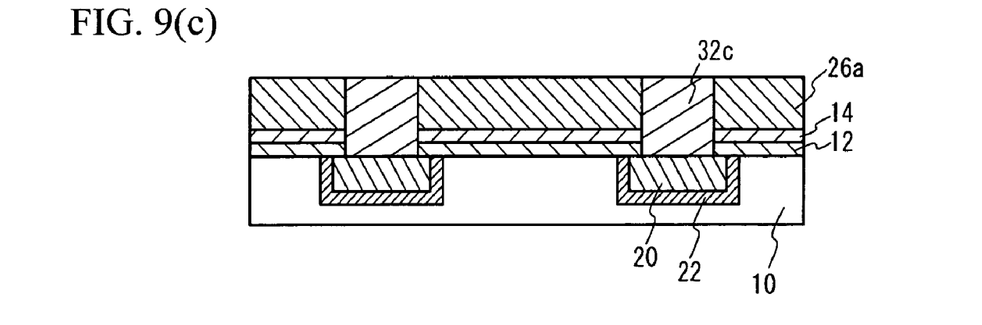

Referring to FIG. 9(b), the polysilicon layer 30 is provided on the protection film 26a and in the openings 54. Referring to FIG. 9(c), the polysilicon layer 30 and the protection film 26a are polished by CMP, with the protection film 26a being polished to a given thickness. In this manner, a conductive layer 32c is formed. The conductive layer 32c has a thickness of, for example, 50 nm.

Figure 9D:
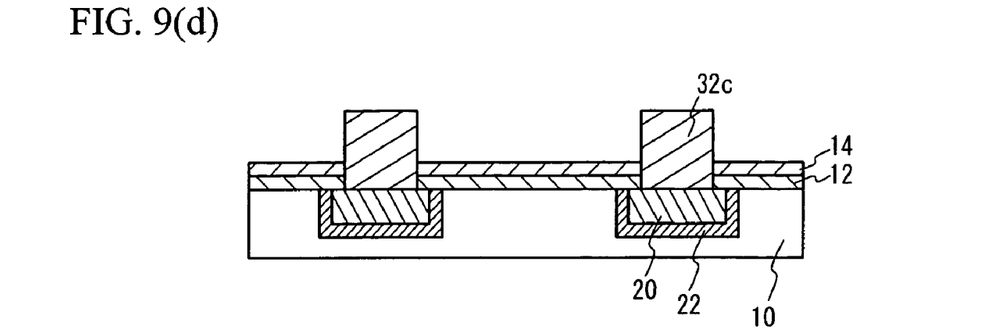
Figure 10A:
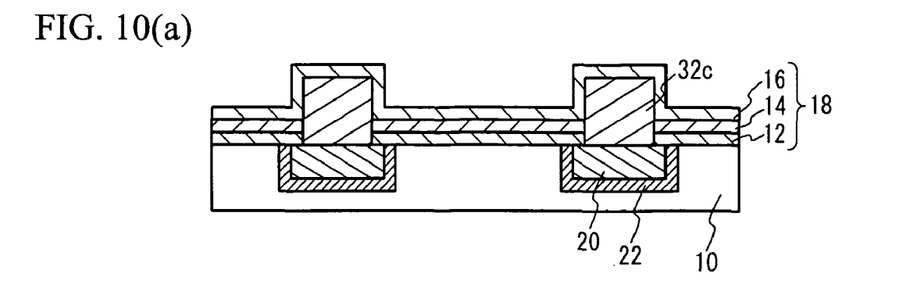
FIG. 10(a) and FIG. 10(b) are additional cross-sectional views illustrating the fabrication method of the flash memory in accordance with the fourth embodiment of the present invention.
Figure 10B:
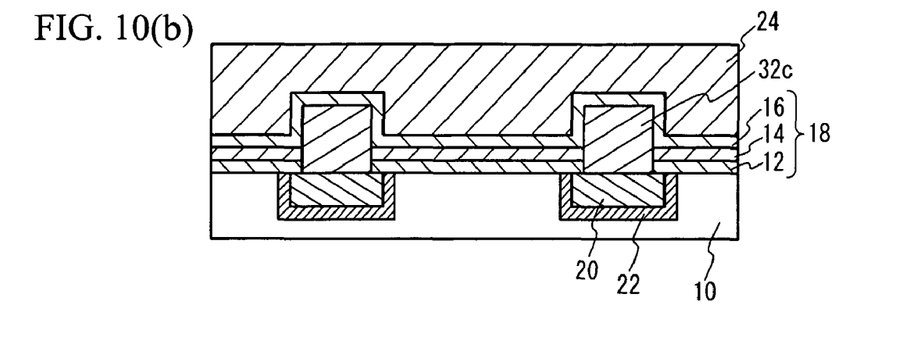

In FIG. 9(d), the protection film 26a is removed by hydrofluoric acid in water. Referring to FIG. 10(a), the top oxide film (silicon oxide film) 16 having a thickness of 10 nm is formed on the trap layer 14 and on the conductive layer 32c. This causes the ONO film 18 to have a thickness of approximately 30 nm. Referring to FIG. 10(b), the word line 24 is formed on the top oxide film 16, in a similar manner as described in accordance with the first embodiment. Subsequently, the interlayer insulating film 40, the metal line 42, and the protection layer 44 are formed. Thus, the flash memory in accordance with the fourth embodiment is manufactured.

In accordance with the fourth embodiment, the protection film 26a is made thicker than the top oxide film 16, and the polysilicon layer 30 and the protection film 26a are polished, with the protection film 26a being polished to a given thickness. The protection film 26a is then removed, and the top oxide film 16 is formed on the trap layer 14. This makes it possible to make the conductive layer 32c thicker than the ONO film 18. Accordingly, in a similar manner as described in accordance with the first embodiment, the resistance of the conductive layer 32c can be lowered. If the conductive layer 32c is made thicker, the planarity of the ONO film 18 is degraded, making it difficult to downsize the memory cell. Therefore, it is preferable that the resistance of the conductive layer 32c and the planarity of the ONO film 18 be considered when determining the thickness of the conductive layer 32c.

Fifth Embodiment

Figure 11A:
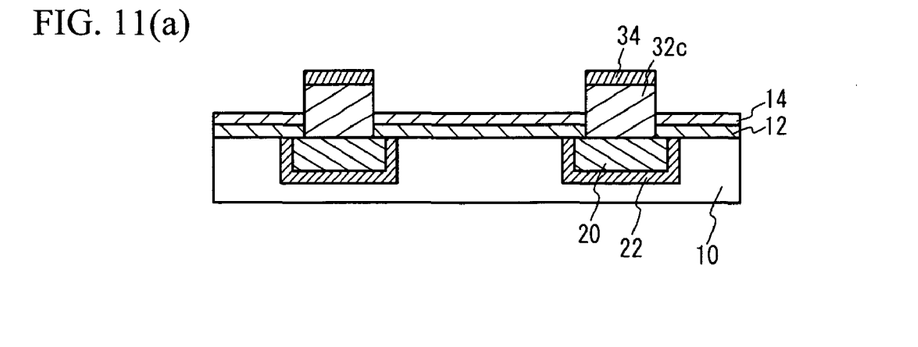
FIG. 11(a) and FIG. 11(b) are cross-sectional views illustrating a fabrication method of a flash memory in accordance with a fifth embodiment of the present invention.
Figure 11B:
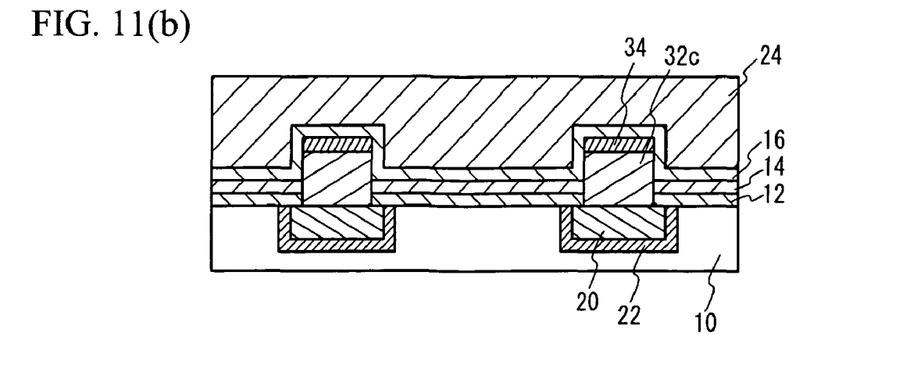

FIGS. 11(a) and 11(b) are cross-sectional views illustrating a fabrication method of a flash memory in accordance with a fifth embodiment of the present invention. Hereinafter, in the description of the process in accordance with the fifth embodiment, the same components and configurations as those in accordance with the fourth embodiment have the same reference numerals and a detailed explanation thereof will be omitted. Referring now to FIG. 11(a), subsequent to the processing step in accordance with the fourth embodiment shown in FIG. 9(d), a metal to be silicided such as cobalt or titanium is deposited on the trap layer (silicon nitride film) 14 and on the conductive layer 32c by, for example, sputtering, and is then treated with heat. The afore-described process forms a silicide surface on the conductive layer 32c. Thus, a metal silicide layer 34 is formed on the conductive layer 32c.

Referring to FIG. 11(b), in a similar fashion as described in accordance with the fourth embodiment, the top oxide film 16 and the word line 24 are formed. Subsequently, the interlayer insulating film 40, the metal line 42, and the protection layer 44 are formed. Thus, a flash memory semiconductor device in accordance with the fifth embodiment is manufactured.

In accordance with the fifth embodiment, the bit line resistance can be lowered as compared to that formed in accordance with the fourth embodiment, by providing the metal silicide layer on the conduction layer 32c, the metal silicide layer having a resistance lower than the resistance of the conductive layer 32c. Accordingly, the bit line resistance can be lowered. This makes it possible to obtain similar advantages as those obtained in the fourth embodiment while suppressing the degradation of the writing and erasing characteristics and the transistor characteristics such as the junction leakage, while additionally lowering the bit line resistance.

During the formation of the metal silicide layer 34, the metal to be silicided is provided on the trap layer (silicon nitride film) 14 and on the conductive layer 32c. The surface of the conductive layer 32c is then silicided by treating with heat. When the metal to be silicided is provided on a silicon oxide film, the surface of the silicon oxide film is, in some cases, also silicided. In order to prevent this, preferably, the metal to be silicided is provided on the silicon nitride film and is then treated with heat.

In addition to the processes described in accordance with the fifth embodiment, there is another exemplary fabrication process where the protection film 26 is not removed before the formation of the metal silicide layer 34. After the silicon nitride film is formed on the protection film (silicon oxide film) 26, the metal silicide layer 34 is formed. After the metal silicide layer 34 is formed, the silicon nitride film may then be removed and a portion of the top oxide film 16 may be formed.

Sixth Embodiment

Figure 12A:
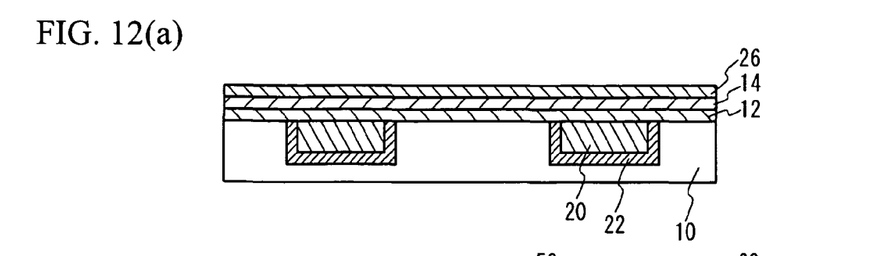
FIG. 12(a) through FIG. 12(e) are cross-sectional views illustrating a fabrication method of a memory cell in accordance with a sixth embodiment of the present invention.
Figure 12B:
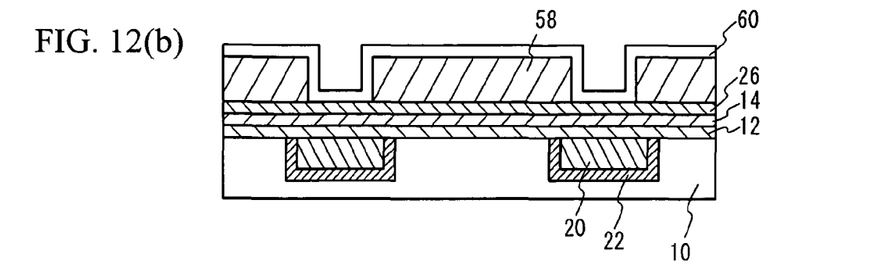

FIGS. 12(a) through 12(e) are cross-sectional views illustrating a fabrication method of a flash memory in accordance with a sixth embodiment of the present invention. Hereinafter, in the description of the process in accordance with the sixth embodiment, the same components and configurations as those in accordance with the third embodiment have the same reference numerals and a detailed explanation thereof will be omitted. FIG. 12(a) corresponds to FIG. 4(a) described in accordance with the first embodiment. Referring to FIG. 12(b) a silicon nitride film, for example, is deposited on the protection film 26 (above the trap layer 14) by CVD, as a mask layer 58. Openings are formed in given regions of the mask layer 58 by conventional lithography and etching techniques. In addition, a silicon nitride film is deposited by CVD for sidewalls 60.

Figure 12C:
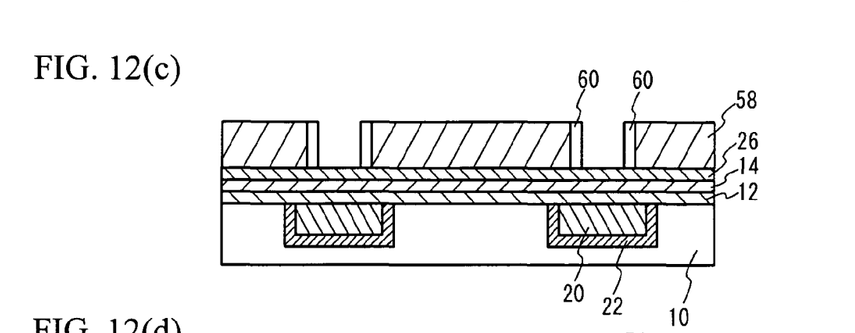
Figure 12D:
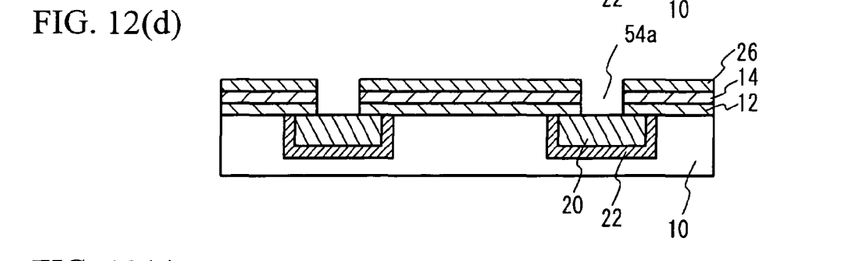

In FIG. 12(c), the sidewalls 60 are formed on side walls of the mask layer 58, by an etch-back process. Referring to FIG. 12(d), the protection film 26, the trap layer 14, and the tunnel oxide film 12 are etched away by use of the mask layer 58 and the sidewalls 60 serving as a mask. The mask layer 58 and the sidewalls 60 are then removed. The mask layer 58 and the sidewalls 60, being formed of the silicon nitride film, can be removed selectively with respect to the protection film 26 of the silicon oxide film. Thus, openings 54a are provided in the protection film 26, the trap layer 14, and the tunnel oxide film 12.

Figure 12E:
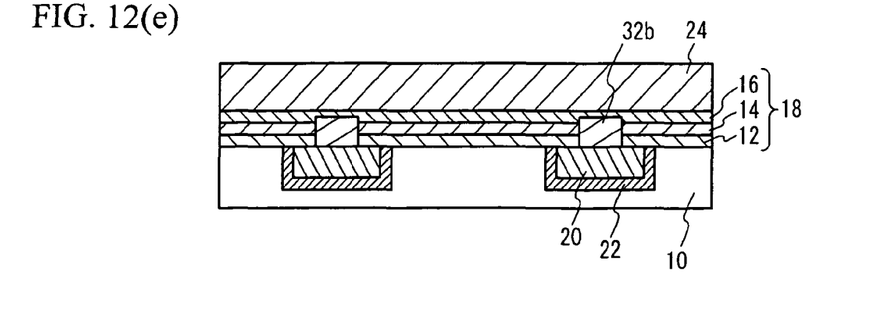

Referring to FIG. 12(e), the conductive layer 32b, the top oxide film 16, and the word line 24 are formed in a similar fashion as shown in FIGS. 8(a) through 8(d) described in accordance with the third embodiment. Subsequently, the interlayer insulating film 40, the metal line 42, and the protection layer 44 are formed, thereby fabricating a flash memory in accordance with the sixth embodiment.

During fabrication in accordance with the sixth embodiment, the openings 54a are provided by use of the mask layer 58 and the sidewalls 60, making it possible to provide openings 54a having a width narrower than a pattern size for lithography. This enables the memory cell to be further downsized. For example, the openings 54a may be provided to have a width of 95 nm, by setting the exposure size to 115 nm and a sidewall width to 10 nm. As described above in accordance with the sixth embodiment, the sidewalls are applied to fabrication in accordance with the third embodiment of the present invention. It can be understood by those skilled in the art that memory cells can be miniaturized by applying the sidewalls of the sixth embodiment to any of the embodiments herein.

Seventh Embodiment

Figure 13:
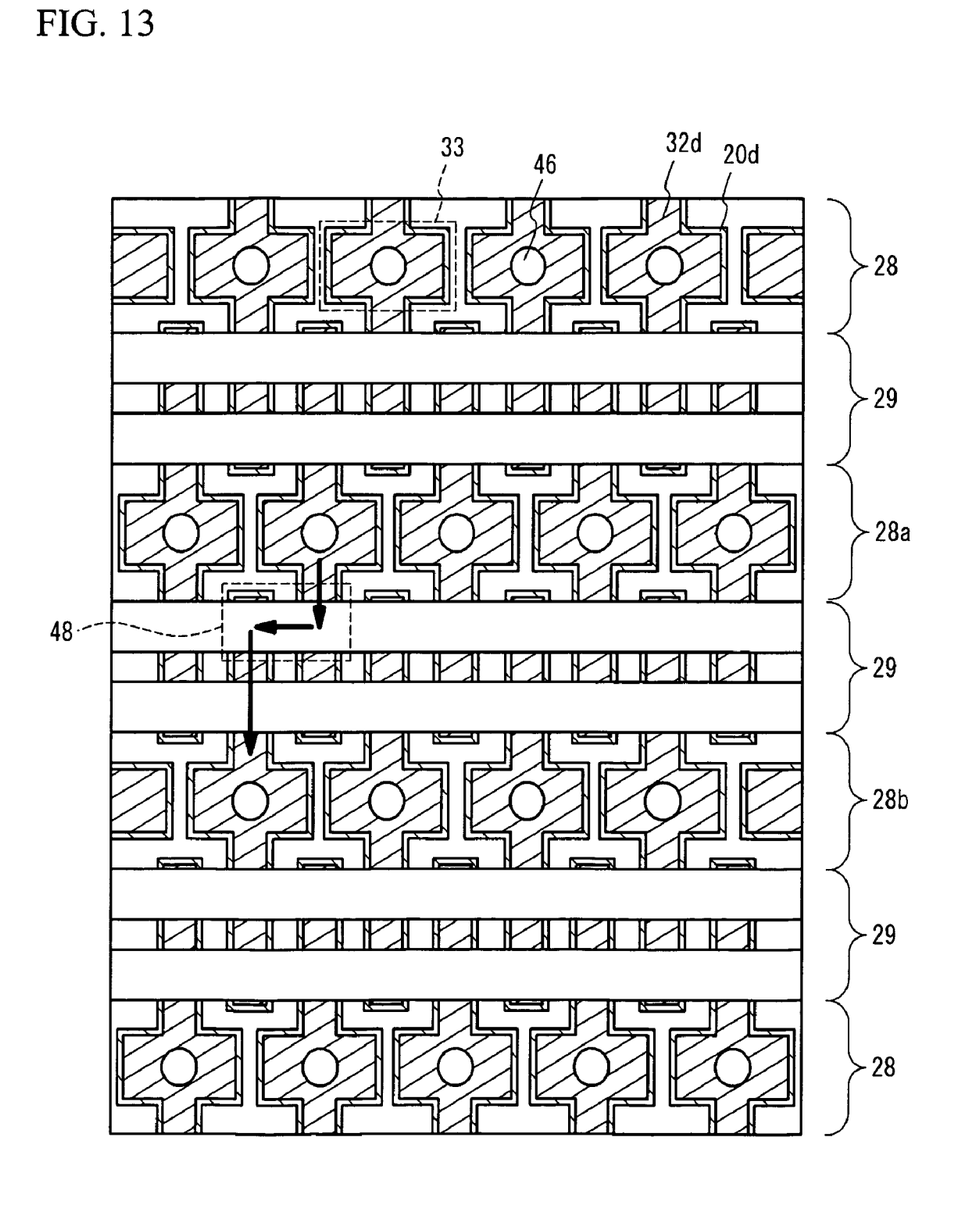
FIG. 13 is a top view of a memory cell in a flash memory in accordance with a seventh embodiment of the present invention.

FIG. 13 is a top view of a memory cell in a flash memory in accordance with a seventh embodiment of the present invention. The protection layer 44, the metal line 42, the interlayer insulating film 40, and the ONO film 18 are not shown. Any of the fabrication processes described in accordance with the first through sixth embodiments may be employed.

In the bit line contact region 28, a contact hole 46 is provided in every other metal line 42, and is connected to a conductive layer 32d. The conductive layer 32d connected to the metal line 42 via the contact hole 46 has a contact pad 33 in the bit line contact region 28, the contact pad 33 having a greater width than that of the conductive layer 32d in the word line region 29. Also, adjacent contact pads 33 are electrically isolated by the semiconductor substrate 10.

The conductive layer 32d has the contact pad 33 for the following reasons. In the bit line contact region 28, the contact hole 46 is provided in every other metal line 42. Therefore, the conductive layer 32d connected to the metal line 42 can be enlarged under the metal line 42 where the contact hole 46 is not provided. It is therefore possible to provide the contact pad 33 in the bit line contact region 28 to have a greater width in the conductive layer 32*d* connected to the metal line 42 via the contact hole 46.

As stated, the contact pad 33 is thus provided in the bit line contact region 28. In addition, the metal line 42 isolated from the conductive layer 32*d* in a bit line contact region 28*a* is connected to the conductive layer 32*d* in an adjacent bit line contact region 28*b*, whereas the bit line contact region 28*a* and the bit line contact region 28*b* are interposed by the word line region 29. Furthermore, the conductive layer 32*d* is connected to one metal line 42 in only one bit line contact region 28, and runs in the word line regions 26 at both sides of the bit line contact regions 28. This design eliminates the necessity that the conductive layer 32*d* runs in the bit line contact region 28 that is not connected to the metal line 42. In other words, the conductive layers 32*d* adjacently arranged in a length direction of the conductive layer 32*d* are electrically isolated in the bit line contact region 28. This makes it possible to shorten the lengths of the conductive layers 32*d*. Thus, with the conductive layer 32*d* connected to the metal line 42 in the bit line contact region 28, the contact pad 33 can be extended to reach below the metal line 42.

From another point of view, current flowing across a transistor 48 is supplied from the bit line contact region 28*a* into the bit line contact region 28*b*, as indicated by the arrows in FIG. 13. In other words, two conductive layers 32*d* connected by the transistor 48 provided in the word line region 26 are respectively connected to the metal lines 42 in the bit line contact regions provided at both sides of the word line region 26.

This eliminates the necessity that the conductive layer 32*d* is extended through the bit line contact region 28 that is not connected to the metal line 42. Therefore, with the conductive layer 32*d* connected to the metal line 42 in the bit line contact region 28, it is possible to extend the contact pad 33 to reach below the metal line 42 in the bit line contact region 28.

In accordance with the seventh embodiment of the present invention, the bit line resistance can be further lowered by providing the conductive layer 32 connected to the bit line 20. This increases the number of the word lines provided in the word line region 29 (two word lines are exemplarily shown in FIG. 13), thereby reducing the number of bit line contact regions 28. In this manner, the memory cell can be downsized.

In addition, even if the contact hole 46 and the conductive layer 32*d* are misaligned, the contact pad 33 prevents the contact hole 46 from deviating from the conductive layer 32*d* (contact pad 33). This enables a spacing width between the conductive layers 32*d* to be smaller than those used in the first through sixth embodiments. When only a pitch between the conductive layers 32*d* is taken into consideration, the pitch between the bit lines 20 can be reduced by approximately a half, as compared to those in the first through sixth embodiments. Thus, the memory cell can be further downsized.

In the first through seventh embodiments described heretofore, the polysilicon layer is employed for the conductive layer 32. However, a metal layer of, for example, TiN/W may be employed. Also with an alternative metal layer, it is possible to obtain similar effects as those described in the first through seventh embodiments.

Thus, it can be seen that, in accordance with the present invention, a conductive layer with a low resistance is capable of reducing the bit line resistance, thereby enabling an increase in the injection energy and dose into the bit line. This can improve the writing and erasing characteristics of the semiconductor device and suppress the junction leakage current thereof. Thus, a semiconductor device can be provided in accordance with the present invention wherein the degradation of the writing and erasing characteristics and the transistor characteristics such as the junction leakage are suppressed while the bit line resistance is further decreased.

In the above-mentioned semiconductor device, the conductive layer may be thicker than the ONO film. Therefore, in accordance with the present invention, the resistance of the conductive layer and the bit line resistance can be further decreased.

In the above-mentioned semiconductor device, the word line may be isolated from the conductive layer by at least a portion of a top oxide film provided in the ONO film. In accordance with the present invention, the word line and the conductive layer may be isolated by a top oxide film having an excellent film quality, further suppressing the leakage current between the word line and the conductive layer.

The above-mentioned semiconductor device may also include a metal silicide layer formed on the conductive layer, thereby providing, in accordance with the present invention, a semiconductor device in which the bit line resistance can be further decreased.

In the above-mentioned semiconductor device, the conductive layer may be embedded in the ONO film, and a surface of the ONO film may be planarized. Thus, in accordance with the present invention, it is possible to form the word line 24 to have a plane surface, permitting the memory cell to be further miniaturized.

Additionally, in the above-mentioned semiconductor device, the conductive layer may be successively formed in a current-flowing direction, thereby, in accordance with the present invention, further reducing the bit line resistance.

The above-mentioned semiconductor device may further include metal lines crossed above word lines and running in the length direction of the bit line and a bit line contact region running in the length direction of the word lines and located between word line regions in which a plurality of word lines are disposed, wherein the conductive layer is connected to every other metal line in the bit line contact region, and wherein, in the bit line contact region, the conductive layer in contact with the metal line has a contact pad having a greater width than that of the bit line provided in the word line regions. In accordance with the present invention, even if the contact hole and the conductive layer are misaligned, the contact hole is prevented from deviating from the conductive layer (contact pad). This allows a spacing width between the bit lines to be decreased and the memory cell to be miniaturized.

According to another aspect of the present invention, preferably, there is provided a method of fabricating a semiconductor device which includes forming a tunnel oxide film and a trap layer on a semiconductor substrate, forming a bit line in the semiconductor substrate, forming an opening in contact with the bit line in the tunnel oxide film and in the trap layer, and forming a conductive layer that includes a polysilicon layer or a metal layer to be in contact with the bit line and run in a length direction of the bit line to provide a semiconductor device that suppresses the degradation of the writing and erasing characteristics and the transistor characteristics such as the junction leakage, and further decreases the bit line resistance.

The above-mentioned method may further include forming a protection film on the trap layer, and forming the opening may include forming the opening in the protection film in order to prevent the trap layer being damaged during subsequent processing.

In the above-mentioned method, forming the conductive layer may also include forming the polysilicon layer or the metal layer in the opening and on the trap layer and etching the polysilicon layer or the metal layer in a region other than the opening. Therefore, in accordance with the present invention, the conductive layer can be thicker than the ONO film.

In the above-mentioned method, a width of the conductive layer may also be greater than that of the ONO film to prevent, in accordance with the present invention, the contact hole from deviating from the conductive layer and to prevent the bit line from being damaged.

The above-mentioned method may further include forming a metal silicide layer on the conductive layer to provide a fabrication method of a semiconductor device in accordance with the present invention wherein the bit line distance can be further decreased.

In the above-mentioned method, forming the conductive layer may additionally include forming the polysilicon layer or the metal layer on the protection film and in the opening and polishing either the polysilicon layer or the metal layer and the protection film to form the word line in accordance with the present invention to have a plane surface, thereby enabling the memory cell to be miniaturized.

In the above-mentioned method, forming the metal silicide layer may include forming a metal layer to be silicided on the conductive layer and on a silicon nitride film in accordance with the present invention to prevent the surface of the silicon oxide film from being silicided.

The above-mentioned method may further include removing the protection film and forming a top oxide film over the trap layer and the conductive layer to isolate, in accordance with the present invention, the word line and the conductive layer by the top oxide film. Accordingly, it is possible to suppress the leakage current between the word line and the conductive layer.

The above-mentioned method may further include forming a portion of the top oxide film over the protection film and the conductive layer, wherein the top oxide film comprises the protection film and the portion of the top oxide film. In accordance with the present invention, the word line and the conductive layer are isolated by a portion of the top oxide film. In addition, the fabrication process can be reduced, since the protection film is not removed. Also, a thickness of the protection film may be greater than that of the top oxide film, permitting the conductive layer to be formed thicker than the ONO film.

The above-mentioned method may further include forming a word line on the top oxide film. In accordance with the present invention, the word line and the conductive layer are isolated by a portion of the top oxide film making it possible to suppress the leakage current between the word line and the conductive layer.

In the above-mentioned method, forming the opening may include etching the trap layer and the tunnel oxide film by using a mask layer and sidewalls as an etching mask, the mask layer being provided above the trap layer, the sidewalls being formed at both sides of the mask layer. In accordance with the present invention, therefore, it is possible to form an opening having a narrower width than a pattern size for lithography, thereby enabling the memory cell to be further miniaturized.

Although a few preferred embodiments of the present invention have been shown and described, it would be appreciated by those skilled in the art that changes may be made in these embodiments without departing from the principles and spirit of the invention, the scope of which is defined in the claims below and their equivalents.

The invention claimed is:

1. A semiconductor device comprising:
an ONO film formed on a semiconductor substrate;
a word line formed on the ONO film;
a bit line formed in the semiconductor substrate; and
a conductive layer in contact with the bit line, the conductive layer overlying the semiconductor substrate and running in a direction of a length of the bit line, wherein the conductive layer runs substantially the entire length of the bit line, and wherein the conductive layer comprises either a polysilicon layer or a metal layer.

2. The semiconductor device as claimed in claim 1, wherein the conductive layer is thicker than the ONO film.

3. The semiconductor device as claimed in claim 2, wherein the bit line resistance may be lowered by increasing the thickness of the conductive layer.

4. The semiconductor device as claimed in claim 2, wherein the bit line resistance may be lowered by increasing the thickness of the conductive layer relative to the ONO film.

5. The semiconductor device as claimed in claim 1, wherein the word line is isolated from the conductive layer by at least a portion of a top oxide film provided in the ONO film.

6. The semiconductor device as claimed in claim 5, wherein the word line and the conductive layer are isolated from each other by a top oxide film.

7. The semiconductor device as claimed in claim 1, wherein the conductive layer is successively formed in a current-flowing direction.

8. The semiconductor device as claimed in claim 1, wherein the conductive layer has a lower resistance than the bit line.

9. The semiconductor device as claimed in claim 1, wherein the conductive layer underlies the word line.

10. A memory device comprising:
an ONO film formed on a semiconductor substrate;
a word line formed on the ONO film;
a bit line formed in the semiconductor substrate; and
a conductive layer in contact with the bit line and running substantially along a length of the bit line, wherein the conductive layer runs substantially the entire length of the bit line, wherein the conductive layer underlies the word line and overlies the semiconductor substrate, and wherein the conductive layer comprises either a polysilicon layer or a metal layer.

11. The memory device as claimed in claim 10, wherein the conductive layer is thicker than the ONO film.

12. The memory device as claimed in claim 11, wherein the bit line resistance may be lowered by increasing the thickness of the conductive layer.

13. The memory device as claimed in claim 11, wherein the bit line resistance may be lowered by increasing the thickness of the conductive layer relative to the ONO film.

14. The memory device as claimed in claim 10, wherein the word line is isolated from the conductive layer by at least a portion of a top oxide film provided in the ONO film.

15. The memory device as claimed in claim 14, wherein the word line and the conductive layer are isolated from each other by a top oxide film.

16. The memory device as claimed in claim 10, wherein the conductive layer is successively formed in a current-flowing direction.

17. The memory device as claimed in claim 10, wherein the conductive layer has a lower resistance than the bit line.

* * * * *